United States Patent
Suzuki et al.

(10) Patent No.: US 12,374,541 B2
(45) Date of Patent: Jul. 29, 2025

(54) SUBSTRATE PROCESSING APPARATUS AND SUBSTRATE PROCESSING METHOD

(71) Applicant: SCREEN Holdings Co., Ltd., Kyoto (JP)

(72) Inventors: Kei Suzuki, Kyoto (JP); Tomohiro Motono, Kyoto (JP); Noritake Sumi, Kyoto (JP); Koji Ando, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 0 days.

(21) Appl. No.: 18/518,056

(22) Filed: Nov. 22, 2023

(65) Prior Publication Data
US 2024/0173754 A1    May 30, 2024

(30) Foreign Application Priority Data

Nov. 30, 2022   (JP) ................................ 2022-191379

(51) Int. Cl.
| | |
|---|---|
| H01L 21/02 | (2006.01) |
| H01L 21/67 | (2006.01) |
| H01L 21/683 | (2006.01) |
| H01L 21/687 | (2006.01) |

(52) U.S. Cl.
CPC .. *H01L 21/02101* (2013.01); *H01L 21/67034* (2013.01); *H01L 21/687* (2013.01); *H01L 21/68735* (2013.01); *H01L 21/6875* (2013.01); *H01L 21/683* (2013.01)

(58) Field of Classification Search
CPC . H01L 21/02101; H01L 21/683–68792; H01L 21/67017–67086
See application file for complete search history.

(56) References Cited

U.S. PATENT DOCUMENTS

| | | | |
|---|---|---|---|
| 2020/0411334 A1 | 12/2020 | Sumi et al. | |
| 2021/0043471 A1* | 2/2021 | Nakata | ............. H01L 21/67253 |
| 2021/0313198 A1 | 10/2021 | Sumi | |
| 2021/0313199 A1 | 10/2021 | Sumi et al. | |

FOREIGN PATENT DOCUMENTS

| | | |
|---|---|---|
| JP | 2021-009875 A | 1/2021 |
| KR | 10-2021-0123230 A | 10/2021 |
| TW | 202141613 A | 11/2021 |
| TW | 202245130 A | 11/2022 |

OTHER PUBLICATIONS

Notice of Allowance dated May 1, 2024 issued in corresponding Taiwanese Patent Application No. 112144005.
Notice of Allowance issued on Jan. 21, 2025 in corresponding Korean Patent Application No. 10-2023-0166278 with its English translation.

* cited by examiner

*Primary Examiner* — Michael E Barr
*Assistant Examiner* — Richard Z. Zhang
(74) *Attorney, Agent, or Firm* — OSTROLENK FABER LLP

(57) ABSTRACT

A substrate processing apparatus according to the present invention includes a support tray that is configured in such a manner that a residual liquid getting in between a lower surface of a substrate and a substrate facing surface of the support tray is trapped in a groove. The support tray further includes a discharge part through which the residual liquid trapped in the groove is discharged from the groove through a discharge part. As a result, backflow of the residual liquid is prevented effectively, thereby preventing re-adhesion of the residual liquid to the upper surface of the substrate.

14 Claims, 10 Drawing Sheets

F I G. 1 A
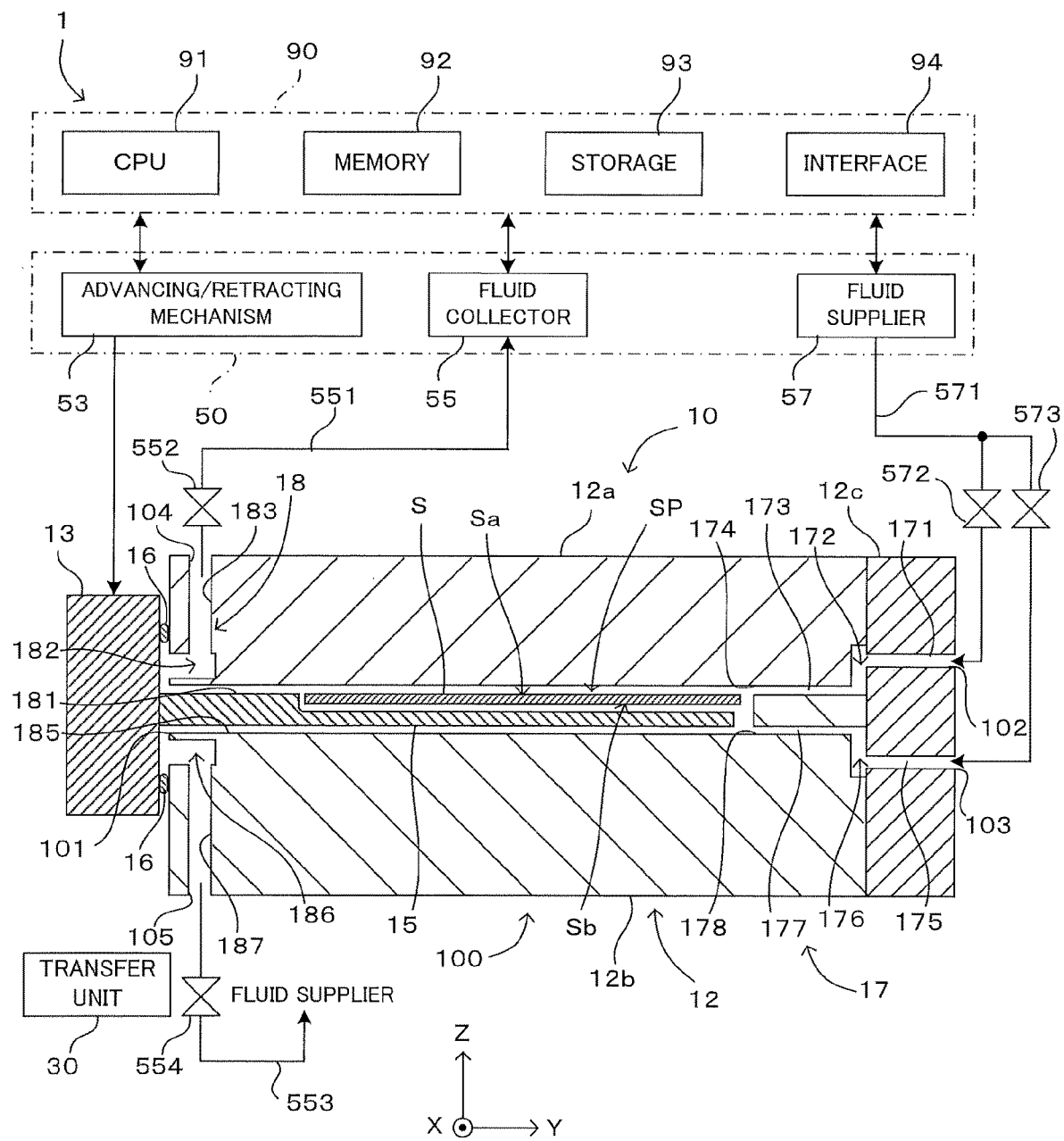

F I G. 5
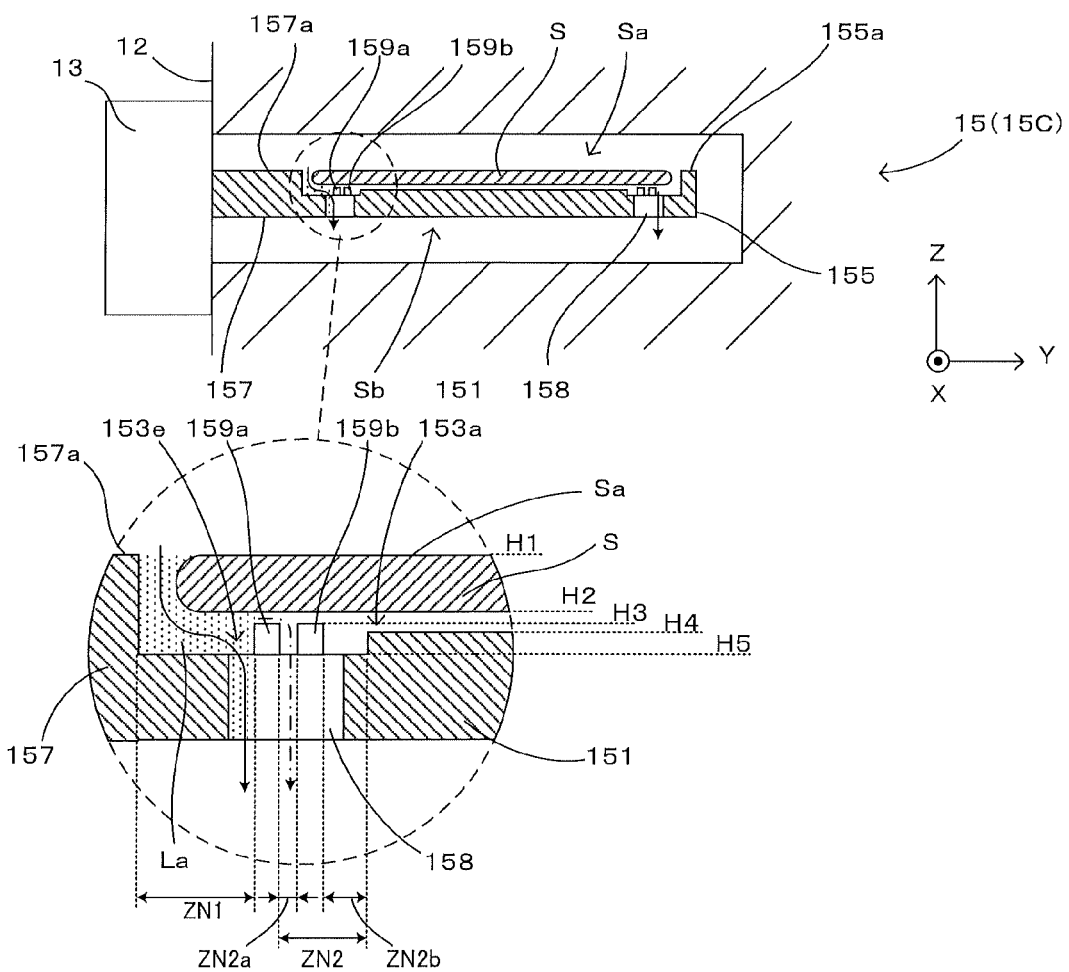

SUBSTRATE PROCESSING APPARATUS AND SUBSTRATE PROCESSING METHOD

CROSS REFERENCE TO RELATED APPLICATION

The disclosure of Japanese Patent Application No. 2022-191379 filed on Nov. 30, 2022 including specification, drawings and claims is incorporated herein by reference in its entirety.

BACKGROUND OF THE INVENTION

1. Field of the Invention

The present invention relates to a substrate processing apparatus and a substrate processing method of processing a substrate with a liquid adhering to the substrate using a processing fluid in a supercritical state.

2. Description of the Related Art

As a result of implementation of a wet-type process on a substrate using a liquid, the liquid adheres to a surface of the substrate. After implementation of the wet-type process, the substrate is dried by a known substrate processing apparatus such as an apparatus described in Japanese Patent Application Laid-Open No. 2021-009875, for example. In this apparatus, a shallow recess is provided in a support tray having a flat plate shape. The substrate is supported horizontally in the recess in a face-up posture in which a surface of the substrate is facing upward while a tiny gap is present from an upper surface of the support tray. The support tray in this state is loaded into a processing chamber and the interior of the chamber is filled with a processing fluid in a supercritical state, thereby processing the substrate (supercritical process).

SUMMARY OF INVENTION

A liquid forming a liquid film covering the substrate during the loading is expected to be removed from the substrate surface by being replaced with the processing fluid. In some cases, however, part of the liquid gets into a narrow gap between a lower surface of the substrate and the upper surface of the support tray. The liquid remaining in the gap, namely, a residual liquid may flow back to the surface of the substrate. This might cause a problem of re-adhesion of the residual liquid to the upper surface of the substrate.

From this viewpoint, preventing backflow of the residual liquid to the upper surface of the substrate is required in the supercritical process. In this regard, the above-described conventional technique can be said to have room for improvement.

The present invention has been made in view of the foregoing issue, and is intended to provide a substrate processing apparatus and a substrate processing method allowing prevention of a liquid from re-adhering to a substrate during removal of the liquid from the substrate using a processing fluid.

One aspect of this invention is directed to a substrate processing apparatus that processes a substrate with a liquid adhering to an upper surface of the substrate using a processing fluid in a supercritical state. The apparatus includes: a support tray including a tray member having a substrate facing surface facing a lower surface of the substrate and a plurality of support members attached to the tray member in such a manner as to surround the substrate facing surface, the support tray supporting the substrate while separating the substrate upward from the substrate facing surface using the support members; a chamber having internal space capable of housing the support tray supporting the substrate; and a fluid supplier configured to supply the processing fluid into the internal space from one end side of the internal space, thereby forming a laminar flow of the processing fluid flowing toward the other end side of the internal space along the upper surface of the substrate supported by the support tray, wherein with the other end side of the internal space with respect to a first virtual line defined as a downstream side, the first virtual line passing through a center of the substrate facing surface and extending in a horizontal direction perpendicular to a flow direction of the laminar flow, the tray member includes: a downstream-side standing portion standing upward further than the substrate facing surface while located in proximity to a peripheral surface of the substrate on the downstream side supported by the plurality of support members; a groove provided in a downstream-side adjoining region belonging to an outer peripheral region of the substrate facing surface and adjoining the downstream-side standing portion, the groove being configured to trap the liquid entering the downstream-side adjoining region through a gap between the substrate and the downstream-side standing portion; and a discharge part configured to connect the interior of the groove to the internal space so as to discharge the liquid trapped in the groove into the internal space.

Other aspect of the invention is a substrate processing method of processing a substrate with a liquid adhering to an upper surface of the substrate using a processing fluid in a supercritical state. The method includes: housing a support tray into internal space of a chamber, the support tray supporting the substrate while separating the substrate upward from a substrate facing surface using a plurality of support members attached to a tray member having the substrate facing surface facing a lower surface of the substrate in such a manner as to surround the substrate facing surface; supplying the processing fluid into the internal space from one end side of the internal space, thereby forming a laminar flow of the processing fluid flowing toward the other end side of the internal space along the upper surface of the substrate supported by the support tray; and discharging, wherein with the other end side of the internal space with respect to a first virtual line defined as a downstream side, the first virtual line passing through a center of the substrate facing surface and extending in a horizontal direction perpendicular to a flow direction of the laminar flow, the discharging operation includes: discharging the liquid together with the processing fluid from the upper surface of the substrate in the laminar flow toward the other end side of the internal space through an upper surface of a downstream-side standing portion standing upward further than the substrate facing surface while located in proximity to a peripheral surface of the substrate on the downstream side; trapping the liquid coming through a gap between the substrate and the downstream-side standing portion in a groove provided in a downstream-side adjoining region belonging to an outer peripheral region of the substrate facing surface and adjoining the downstream-side standing portion; and discharging the liquid trapped in the groove into the internal space through a discharge part forming communication between the interior of the groove and the internal space.

According to the invention having the above-described configuration, the support tray supports the substrate while separating the substrate upward from the substrate facing surface of the support tray. Furthermore, in the support tray, the downstream-side standing portion is provided in proximity to the peripheral surface of the substrate on the downstream side. Thus, while part of the liquid gets in between the lower surface of the substrate and the substrate facing surface from the gap between the substrate and the downstream-side standing portion, this entering liquid, namely, a residual liquid is trapped in the groove. The trapped residual liquid is discharged into the internal space through the discharge part. As a result, backflow of the residual liquid is prevented effectively, thereby preventing re-adhesion of the residual liquid to the upper surface of the substrate.

As described above, according to the present invention, the support tray is configured in such a manner that the residual liquid getting in between the lower surface of the substrate and the substrate facing surface from the gap between the substrate and the downstream-side standing portion is trapped in the groove, and the residual liquid is discharged from the groove into the internal space through the discharge part. Thus, during removal of the liquid from the substrate using the processing fluid, it is possible to reduce the amount of the residual liquid considerably, thereby preventing re-adhesion of the liquid to the substrate effectively.

All of a plurality of constituent elements of each aspect of the invention described above are not essential and some of the plurality of constituent elements can be appropriately changed, deleted, replaced by other new constituent elements or have limited contents partially deleted in order to solve some or all of the aforementioned problems or to achieve some or all of effects described in this specification. Further, some or all of technical features included in one aspect of the invention described above can be combined with some or all of technical features included in another aspect of the invention described above to obtain one independent form of the invention in order to solve some or all of the aforementioned problems or to achieve some or all of the effects described in this specification.

BRIEF DESCRIPTION OF THE DRAWINGS

FIG. 1A shows an overall configuration of a substrate processing apparatus to which the present invention is applicable.

FIG. 5 is a perspective view showing the third embodiment of the support tray.

DETAILED DESCRIPTION OF THE PREFERRED EMBODIMENTS

Some embodiments of a substrate processing apparatus according to the present invention will be described below. A basic apparatus configuration is common while the configuration of a support tray partially differs between the embodiments. An overall configuration of the substrate processing apparatus will be described first and then characteristic parts of the corresponding embodiments will be described individually.

<Overall Configuration of Apparatus>

Figure 1B:
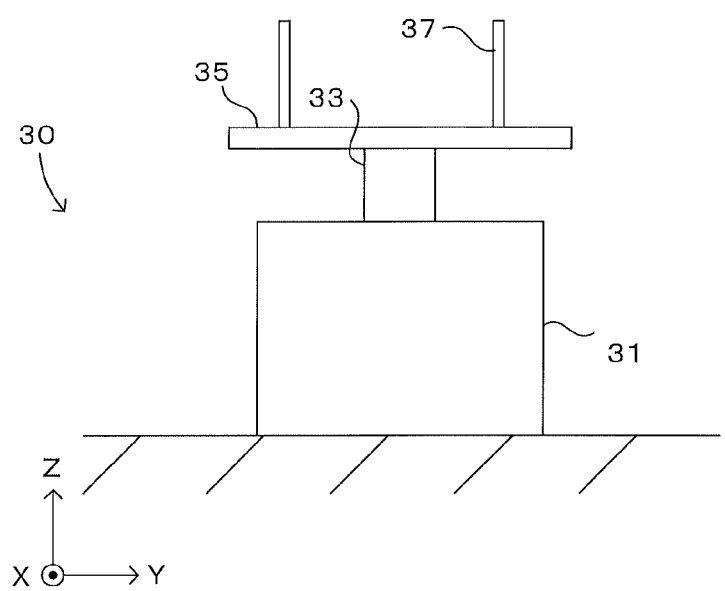
FIG. 1B shows a structure of a transfer unit equipped in the substrate processing apparatus of FIG. 1A.

FIG. 1A shows an overall configuration of a substrate processing apparatus to which the present invention is applicable. FIG. 1B shows a structure of a transfer unit equipped in the substrate processing apparatus of FIG. 1A. The substrate processing apparatus 1 is an apparatus for processing an upper surface of each type of substrate such as a semiconductor substrate, for example, using a supercritical fluid. For example, the substrate processing apparatus 1 is capable of performing a supercritical drying process of drying a substrate by replacing a liquid (indicated by a sign L in FIGS. 2A, 4A, and 6A) adhering to the substrate with a supercritical processing fluid. To show directions in a unified manner in the drawings referred to below, an XYZ orthogonal coordinate system is defined as shown in FIG. 1A and FIG. 1B. An XY plane represents a horizontal plane. A Z direction represents a vertical direction. More specifically a (−Z) direction represents a vertically downward direction.

Here, various substrates such as semiconductor wafers, glass substrates for photomask, glass substrates for liquid crystal display, glass substrates for plasma display, substrates for FED (Field Emission Display), substrates for optical disk, substrates for magnetic disk, and substrates for magneto-optical disk can be adopted as the "substrate" in this embodiment. A substrate processing apparatus used to process a semiconductor wafer is mainly described as an example with reference to the drawings, but the substrate processing apparatus can be adopted also to process various substrates illustrated above. A substrate S used as an example in the following description has a circuit pattern, etc. formed only on one main surface thereof. Here, a surface corresponding to the main surface with the circuit pattern, etc. will be called a "front surface," and a main surface on the opposite side without a circuit pattern, etc. will be called a "back surface." Furthermore, a surface of the substrate S facing downward will be called a "lower surface," and a surface of the substrate S facing upward will be called an "upper surface." In the example descried below, the substrate S to be processed is in a posture in which the front surface of the substrate S is facing upward, namely, in a posture in which the front surface corresponds to the upper surface.

The substrate processing apparatus 1 includes a processing unit 10, a transfer unit 30, a supply unit 50 and a control unit 90. The processing unit 10 serves as an execution subject of a supercritical drying process. The transfer unit 30 receives an unprocessed substrate S transported by an external conveying device not shown in the figure and carries the substrate S into the processing unit 10. Further, the transfer unit 30 delivers a processed substrate S from the processing unit 10 to the external conveying device. The supply unit 50 supplies chemical substances, power, energy and the like necessary for the process to the processing unit 10 and the transfer unit 30.

The control unit 90 realizes a predetermined process by controlling these components of the apparatus. For this purpose, the control unit 90 includes a CPU 91 for executing various control programs, a memory 92 for temporarily storing processing data, a storage 93 for storing the control programs to be executed by the CPU 91, an interface 94 for information exchange with a user and an external apparatus, and the like. Operations of the apparatus to be described later are realized by the CPU 91 causing each component of the apparatus to perform a predetermined operation by executing the control program written in the storage 93 in advance.

The processing unit 10 includes a processing chamber 12. The processing chamber 12 includes a first member 12a, a second member 12b, and a third member 12c each composed of a metal block. The first member 12a and the second member 12b are coupled to each other in the vertical direction by a coupling member not shown in the drawings, and the third member 12c is coupled to respective side surfaces of the first member 12a and the second member 12b on a (+Y) side by a coupling member not shown in the drawings, thereby forming the processing chamber 12 having a configuration with a hollow interior. This hollow internal space functions as internal space SP for implementation of a process on the substrate S. The substrate S as a target is loaded into the internal space SP and processed therein. An opening 101 like a slit elongated in an X direction is formed at a side surface of the processing chamber 12 on a (−Y) side. The internal space SP and external space communicate with each other through the opening 101.

A lid member 13 is provided on the (−Y) side surface of the processing chamber 12 to close the opening 101. A support tray 15 in the form of a flat plate is attached in a horizontal posture to a (+Y) side surface of the lid member 13. An upper surface 151 of the support tray 15 serves as a support surface on which the substrate S can be placed. The various forms of support trays 15 are described in more detail later.

The lid member 13 is movable toward and away from the processing chamber 12 by an advancing/retracting mechanism 53 provided in the supply unit 50. Specifically, the advancing/retracting mechanism 53 includes a linear motion mechanism such as a linear motor, a linear guide, a ball-screw mechanism, a solenoid or an air cylinder. Such a linear motion mechanism moves the lid member 13 in the Y direction. The advancing/retracting mechanism 53 operates in response to a control command from the control unit 90.

If the support tray 15 is pulled out from the internal space SP to outside via the opening 101 by a movement of the lid member 13 in a (−Y) direction, the support tray 15 is accessible from outside. Specifically, it becomes possible to place the substrate S on the support tray 15 and take out the substrate S placed on the support tray 15. On the other hand, the lid member 13 moves in a (+Y) direction, whereby the support tray 15 is accommodated into the internal space SP. If the substrate S is placed on the support tray 15, the substrate S is carried into the internal space SP together with the support tray 15.

In the supercritical drying process mainly intended to dry a substrate while preventing pattern collapse due to surface tension of a liquid, the substrate S is loaded while an upper surface Sa of the substrate S is covered with a liquid film for the purpose of preventing pattern collapse to occur if the upper surface Sa is exposed. An organic solvent of relatively low surface tension that may be isopropyl alcohol (IPA) or acetone, for example, is used preferably as a liquid to form the liquid film.

The lid member 13 moves in the (+Y) direction to close the opening 101, thereby enclosing the internal space SP. A seal member 16 is provided between the side surface of the lid member 13 on the (+Y) side and the side surface of the processing chamber 12 on the (−Y) side to maintain an air-tight condition in the internal space SP. The seal member 16 may be formed using a ring-like member made of an elastic resin material such as rubber, for example. Furthermore, the lid member 13 is fixed to the processing chamber 12 by a lock mechanism not shown in the drawings. While the air-tight condition is ensured in this way in the internal space SP, the substrate S is processed in the internal space SP.

According to the present embodiment, a fluid supplier 57 provided to the supply unit 50 supplies the processing unit 10 with a fluid of a substance available for the supercritical process in a gas or liquid form that may be carbon dioxide, for example. Carbon dioxide is a chemical substance suitable for the supercritical drying process in that it has a property of being brought to a supercritical state in a relatively low temperature and a relatively low pressure and dissolving an organic solvent well used frequently in a substrate process.

More specifically, the fluid supplier 57 outputs a processing fluid for processing the substrate S that is a fluid in a supercritical state or a fluid supplied in a gas form or in a liquid form and to be brought to a supercritical state thereafter by being supplied with a predetermined temperature and a predetermined pressure. For example, carbon dioxide is output in a gas form or in a liquid form. The fluid is fed under pressure to an input port 102 and an input port 103 provided at a side surface of the processing chamber 12 on the (+Y) side through a pipe 571, and a valve 572 and a valve 573 interposed in the pipe 571. Specifically, by opening the valves 572 and 573 in response to a control command from the control unit 90, the fluid is fed from the fluid supplier 57 to the processing chamber 12.

A flow path 17 of the fluid from the input ports 102 and 103 to the internal space SP functions as an introduction flow path for introducing the processing fluid supplied from the fluid supplier 57 into the internal space SP. More specifically, a flow path 171 is connected to the input port 102. The flow path 171 has an end on the opposite side to the input port 102 where buffer space 172 is provided having a flow path sectional area increased steeply.

A flow path 173 is provided further in such a manner as to connect the buffer space 172 and the internal space SP to each other. The flow path 173 has a broad sectional shape narrow in the vertical direction (Z direction) and extending long in a horizontal direction (X direction). This sectional shape is substantially constant in a flow direction of the processing fluid. The flow path 173 has an end on the opposite side to the buffer space 172 that functions as an ejection port 174 having an opening bordering the internal space SP. The processing fluid is introduced through the ejection port 174 into the internal space SP.

Desirably, the height of the flow path 173 is equal to a distance between a ceiling surface of the internal space SP and the upper surface Sa of the substrate S with the support tray 15 housed in the internal space SP. The ejection port 174 is opened while bordering a gap between the ceiling surface of the internal space SP and the upper surface of the support tray 15. For example, a ceiling surface of the flow path 173 and the ceiling surface of the internal space SP may form the same plane. In this way, the ejection port 174 is opened into a slit shape elongated in the horizontal direction while bordering the internal space SP.

A flow path of the processing fluid is formed under the support tray 15 in the same way. More specifically, a flow path 175 is connected to the input port 103. The flow path 175 has an end on the opposite side to the input port 103 where buffer space 176 is provided having a flow path sectional area increased steeply.

The buffer space 176 and the internal space SP communicate with each other through a flow path 177. The flow path 177 has a broad sectional shape narrow in the vertical direction (Z direction) and extending long in the horizontal direction (X direction). This sectional shape is substantially constant in the flow direction of the processing fluid. The flow path 177 has an end on the opposite side to the buffer space 176 that functions as an ejection port 178 having an opening bordering the internal space SP. The processing fluid is introduced through the ejection port 178 into the internal space SP.

Desirably, the height of the flow path 177 is substantially equal to a distance between a bottom surface of the internal space SP and a lower surface of the support tray 15. The ejection port 178 is opened while bordering a gap between the bottom surface of the internal space SP and the lower surface of the support tray 15. For example, a bottom surface of the flow path 177 and the bottom surface of the internal space SP may form the same plane. Specifically, the ejection port 178 is opened into a slit shape elongated in the horizontal direction while bordering the internal space SP.

Desirably, the flow path 171 and the flow path 173 are arranged at positions differing from each other in the Z direction. If the flow paths 171 and 173 are at the same height, part of the processing fluid having flowed from the flow path 171 into the buffer space 172 travels straight directly into the flow path 173. This causes a risk that the flow rate or flow speed of the processing fluid flowing into the flow path 173 will differ between a position corresponding to the flow path 171 and a position not corresponding to the flow path 171 in a width direction of the flow path perpendicular to the flow direction, namely, in the X direction. This causes non-uniformity in the flow of the processing fluid in the X direction flowing from the flow path 173 into the internal space SP to become a cause for a disturbed flow.

Arranging the flow path 171 and the flow path 173 at different positions in the Z direction prevents the occurrence of such straight travel of the processing fluid from the flow path 171 to the flow path 173. As a result, it becomes possible to introduce the processing fluid in a laminar flow uniform in the width direction into the internal space SP.

The processing fluid introduced through the introduction flow path 17 having the foregoing configuration flows along the upper surface and the lower surface of the support tray 15 in the internal space SP and is discharged to the outside of the chamber through a flow path 18 having a configuration described next. Both the ceiling surface of the internal space SP and the upper surface of the support tray 15 form horizontal planes on the (−Y) side relative to the substrate S while extending parallel to each other in facing positions with a certain gap maintained therebetween. This gap functions as an upper flow path 181 for guiding the processing fluid having flowed along the upper surface of the support tray 15 and the upper surface Sa of the substrate S to a discharge flow path described later. Specifically, the upper flow path 181 has a broad sectional shape narrow in the vertical direction (Z direction) and extending long in the horizontal direction (X direction).

The upper flow path 181 has an end on the opposite side to the internal space SP that is connected to buffer space 182. While a particular configuration of the buffer space 182 will be described later, the buffer space 182 is space surrounded by a chamber 100, a lid part 13, and the seal member 16. The buffer space 182 has a width in the X direction that is substantially equal to or greater than the corresponding width of the upper flow path 181, and a height in the Z direction that is greater than the corresponding height of the upper flow path 181. Thus, the buffer space 182 has a larger flow path sectional area than the upper flow path 181.

A discharge flow path 183 is connected to the top of the buffer space 182. The discharge flow path 183 is a through hole penetrating the first member 12a as an upper block forming the chamber 100. The discharge flow path 183 has an upper end that forms an output port 104 opened at an upper surface of the chamber 100, and a lower end that has an opening bordering the buffer space 182.

Likewise, both the bottom surface of the internal space SP and the lower surface of the support tray 15 form horizontal planes while extending parallel to each other in facing positions with a certain gap maintained therebetween. This gap functions as a lower flow path 185 for guiding the processing fluid having flowed along the lower surface of the support tray 15 to the discharge flow path. Specifically, the lower flow path 185 has a broad sectional shape narrow in the vertical direction (Z direction) and extending long in the horizontal direction (X direction).

The lower flow path 185 has an end on the opposite side to the internal space SP that is connected to buffer space 186. Like the buffer space 182, the buffer space 186 is space surrounded by the chamber 100, the lid part 13, and the seal member 16. The buffer space 186 has a width in the X direction that is substantially equal to or greater than the corresponding width of the lower flow path 185, and a height in the Z direction that is greater than the corresponding height of the lower flow path 185. Thus, the buffer space 186 has a larger flow path sectional area than the lower flow path 185.

A discharge flow path 187 is connected to the bottom of the buffer space 186. The discharge flow path 187 is a through hole penetrating the second member 12b as a lower block forming the chamber 100. The discharge flow path 187 has a lower end that forms an output port 105 opened at a lower surface of the chamber 100, and an upper end that has an opening bordering the buffer space 186.

The processing fluid having flowed over the support tray 15 in the internal space SP is delivered to the output port 104 through the upper flow path 181, the buffer space 182, and the discharge flow path 183. The output port 104 is connected to a fluid collector 55 through a pipe 551, and a valve 552 is interposed in the pipe 551.

Likewise, the processing fluid having flowed under the support tray 15 in the internal space SP is delivered to the output port 105 through the lower flow path 185, the buffer space 186, and the discharge flow path 187. The output port 105 is connected to the fluid collector 55 through a pipe 553, and a valve 554 is interposed in the pipe 553.

The valves 552 and 554 are controlled by the control unit 90. By opening the valves 552 and 554 in response to a control command from the control unit 90, the processing fluid in the internal space SP is collected in the fluid collector 55 through the pipes 551 and 553.

After the processing fluid is fed under pressure from the fluid supplier 57 to the input port 102, the processing fluid passes through the flow path 171 and is then released into the buffer space 172 as comparatively large space. Even if the fluid is supplied in a liquid form, there is still a likelihood that the fluid will vaporize to expand in the flow path due to fluctuation in pressure loss in the flow path, for example. The occurrence of such abrupt expansion in the vicinity of the substrate S causes a risk of damage on the substrate S.

In order to avoid this, an area where large fluctuation in pressure loss is to occur is provided in a part of the flow path 171 leading to the internal space SP to cause possible vaporization and expansion to occur in this area. The buffer space 172 is provided as space for this purpose. The buffer space 172 further has a function as a straightening manifold for allowing the fluid flowing in the tubular flow path 171 to be supplied in a laminar pattern into the internal space SP. The buffer space 176 functions in the same way.

After the processing fluid is supplied from the buffer space 172 into the internal space SP through the flow path 173 having a certain flow path sectional area and then through the ejection port 174, the processing fluid passes over the upper surface Sa of the substrate S in a laminar flow maintaining a certain width and a certain thickness. Likewise, after the processing fluid is supplied from the buffer space 176 into the internal space SP through the flow path 177 having a certain flow path sectional area and then through the ejection port 178, the processing fluid flows along the lower surface of the support tray 15 in a laminar flow maintaining a certain width and a certain thickness.

After the processing fluid passes around the substrate S, the processing fluid travels through the upper flow path 181 and the lower flow path 185 and then flows further toward a downstream side. As the sectional shape of the flow path is also maintained substantially uniformly on the downstream side, the laminar flow state is maintained. After the processing fluid flows through the upper flow path 181 and the lower flow path 185, the processing fluid is released into the buffer space 182 and the buffer space 186 and then discharged to the outside of the chamber through the discharge flow paths 183 and 187. In this way, the processing fluid in the internal space SP flows toward one direction, more specifically, toward the (−Y) direction. This prevents the occurrence of a disturbed flow in the processing fluid around the substrate S.

When the internal space SP is viewed from the opening 101, the processing fluid is to flow in the internal space SP in a substantially uniform and continuous laminar flow from the (+Y) side (back side) toward the (−Y) side (front side) of the substrate S. The clean processing fluid is always supplied from the back side of the internal space SP. After the processing fluid travels around the substrate S, the processing fluid flows toward the downstream side, namely, toward the opening 101. This pushes a component in a residual liquid, etc. having been liberated from the substrate S away together with the processing fluid in the one direction toward the opening 101, thereby preventing such a component from being carried in a disturbed flow around the substrate S and re-adhering to the substrate S.

The transfer unit 30 is responsible for transfer of the substrate S between the external transport device and the support tray 15. For this purpose, the transfer unit 30 includes a body 31, an elevating member 33, a base member 35, and a plurality of lift pins 37. The elevating member 33 is a columnar member extending in the Z direction and is supported movably in the Z direction by the body 31.

A base member 35 having a substantially horizontal upper surface is mounted on the top of the elevating member 33. The lift pins 37 are provided upward in standing positions from the upper surface of the base member 35. Each of the lift pins 37 has an upper end to abut on the lower surface of the substrate S, thereby supporting the substrate S from below in a horizontal posture. To support the substrate S stably, it is desirable to provide three or more lift pins 37 having upper ends of heights equal to each other.

The elevating member 33 can be moved up and down under control by an elevating controller (not shown in the drawings) provided to the supply unit 50. More specifically, the body 31 of the transfer unit 30 is provided with a linear motion mechanism (not shown in the drawings) such as a liner motor, a linear motion guide, a ball screw mechanism, a solenoid, or an air cylinder, for example, and such a linear motion mechanism moves the elevating member 33 in the Z direction under control by the elevating controller. The elevating controller operates in response to a control command from the control unit 90.

The base member 35 is moved up and down by upward and downward movements of the elevating member 33, and the plurality of lift pins 37 move up and down integrally with the base member 35. In this way, the transfer of the substrate S is realized between the transfer unit 30 and the support tray 15. The specifics are as follows.

As described later, the support tray 15 is provided with a through hole corresponding to each of the lift pins 37 of the transfer unit 30. Specifically, the through hole is formed at a position to become directly above each of the lift pins 37 when the support tray 15 is pulled out of the processing chamber 12. When the elevating member 33 moves up and down to move up the base member 35, each of the lift pins 37 passes through the through hole at the support tray 15 to reach a position where a tip of the lift pin 37 is above an upper surface of the support tray 15. In this state, the unprocessed substrate S, having been transported by an external carrier such as a transport robot having a hand capable of holding a substrate, for example, is transferred to the lift pins 37.

In response to the downward movement of the lift pins 37 holding the substrate S, the substrate S also moves down. Then, the lift pins 37 move down further while the substrate S contacts the upper surface of the support tray 15. By doing so, the substrate S is transferred from the lift pins 37 to the support tray 15 and becomes supported by the support tray 15. In this way, the substrate S is loaded into the substrate processing apparatus 1. The lift pins 37 finally go down to positions where the lift pins 37 do not interfere with the motion of opening and closing the lid member 13.

The substrate S can be unloaded from the substrate processing apparatus 1 through a procedure reverse to that described above. Specifically, the lift pins 37 move up while the substrate S is supported by the support tray 15 to raise the substrate S. This generates space between the lower surface of the substrate S and the upper surface of the support tray 15 and the hand of the transport robot is introduced into this space. By doing so, the substrate S can be transferred from the lift pins 37 to the transport robot.

As described above, the supercritical drying process is performed on the substrate S in the substrate processing apparatus 1. A sequential flow of this process is as follows. First, the substrate S with the upper surface Sa covered with a film of a liquid is loaded from outside and placed on the support tray 15. The support tray 15 enters the internal space SP of the processing chamber 12, thereby housing the substrate S into the internal space SP (housing step). Then, with the internal space SP closed by the lid member 13, a processing fluid in a gas or liquid form is supplied from the fluid supplier 57 to the internal space SP (supplying step).

The processing fluid flows along the upper surface Sa of the substrate S supported by the support tray 15 from a (+Y) direction side toward a (−Y) direction side. The processing fluid in such a laminar flow is pressurized in the internal space SP to be brought to a supercritical state. By doing so, the liquid on the substrate S is replaced with the supercritical processing fluid. Supply of the processing fluid from the fluid supplier 57 and discharge of the processing fluid by the fluid collector 55 are continued for a certain period of time, thereby discharging the liquid coming off the substrate S (discharging step). Finally, the processing fluid makes a phase transition from a supercritical state to a gas phase without intervention of a liquid phase and is discharged, thereby bringing the substrate S to a dry state.

The following describes some embodiments of the support tray 15 (support trays 15A to 15E) in the substrate processing apparatus 1 described above. The configuration of the support tray 15 partially differs between the embodiments but the support tray 15 is otherwise common between the embodiments and operates in the manner described above. In the following descriptions of the embodiments, structures having a common configuration or function will be given the same sign or corresponding signs, and these structures will not be described repeatedly. Furthermore, regarding structures shown in a plurality of drawings and having association clearly understandable from the drawings, insertion of signs may be omitted in some of the drawings.

First Embodiment

Figure 2A:
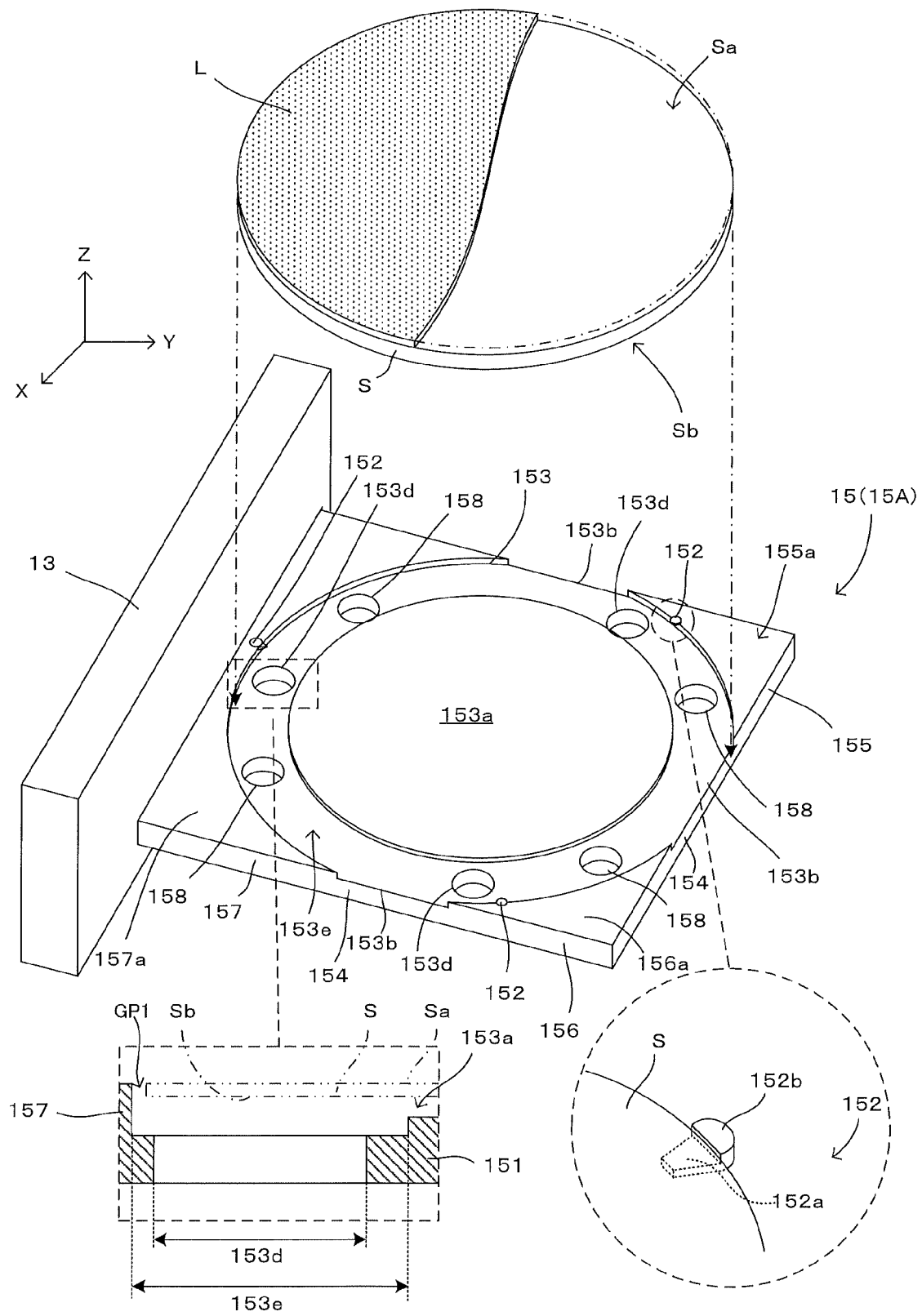
FIG. 2A is a perspective view showing a first embodiment of the support tray.
Figure 2B:
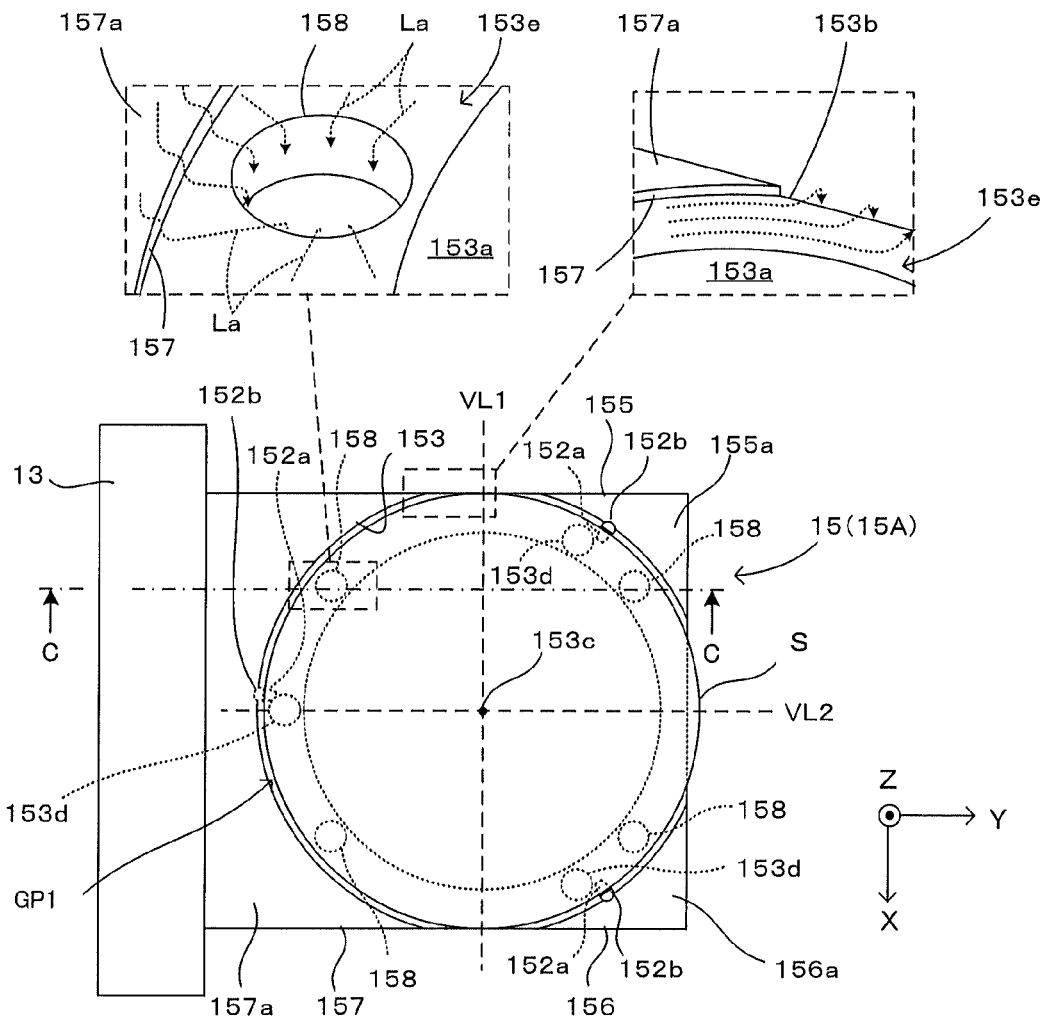
FIG. 2B is a plan view of the support tray shown in FIG. 2A.
Figure 2C:
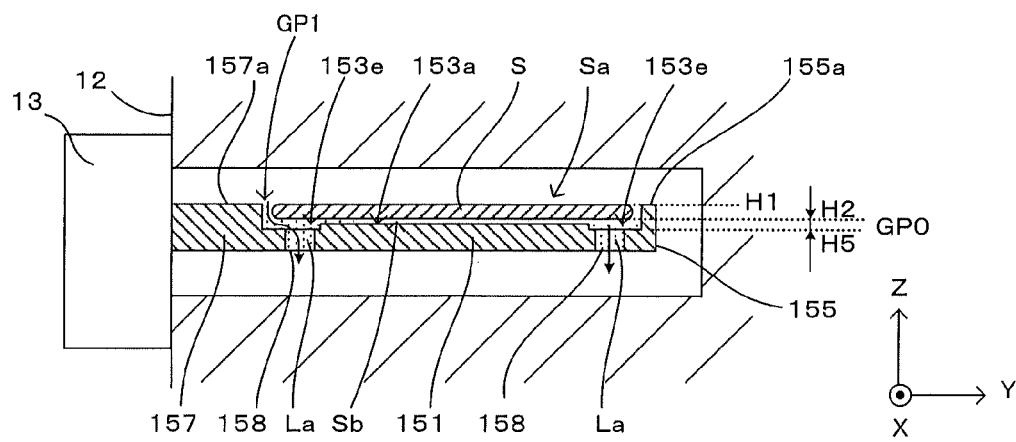
FIG. 2C is a sectional view taken along a line C-C in FIG. 2B.

FIG. 2A is a perspective view showing a first embodiment of the support tray. FIG. 2B is a plan view of the support tray shown in FIG. 2A. FIG. 2B includes a partially enlarged view schematically showing how liquid is discharged through the through holes and cutout portions in the support tray. FIG. 2C is a sectional view taken along a line C-C in FIG. 2B. In FIGS. 2B and 2C (FIGS. 3, 4C, and 5, which will be discussed later), dots are added for reference purposes to indicate residual liquid. The support tray 15A of the first embodiment includes a tray member 151 and a plurality of support pins 152. The tray member 151 has a configuration where a recess 153 having a size conforming to the planar size of the substrate S, specifically, having a diameter slightly larger than the diameter of the circular substrate S is formed at a horizontal and planar upper surface of a structure of a flat plate shape, for example. The recess 153 has a bottom surface 153a formed into a horizontal surface and corresponding to an example of a "substrate facing surface" of the present invention. The entire circumferential area of the bottom 153a is further depressed than the central area, thereby forming a groove 153e.

The recess 153 partially extends as far as to a side surface 154 of the tray member 151 (FIG. 2A). Specifically, the recess 153 has a side wall surface that is not a circular shape but is partially cut out. More specifically, this cutout portion (hereinafter called "cutout portion 153b") forms a notch at a side surface of the groove 153e to directly connect to the side surface 154. In this example, the cutout portions 153b are formed at both end portions of the support tray 15A on the X side and at an end portion of the support tray 15A on the (+Y) side, and the groove 153e communicates with the outside of the support tray 15A at these cutout portions 153b. This allows a liquid L (more specifically, a residual liquid La described later) trapped in the groove 153e in a way described later to be discharged to the outside of the support tray 15A through the cutout portions 153b. In this way, the cutout portions 153b function as a "discharge part" of the present invention.

The presence of the cutout portions 153b provides three standing portions 155 to 157 at the tray member 151. The tray member 151 is a base plate having a flat plate shape, and the standing portions 155 to 157 are plates having flat plate shapes mounted on or formed integrally with the tray member (base plate) 151. The particular configurations and functions thereof will be described later in detail.

A through hole 158 as a passage for the lift pin 37 of the transfer unit 30 is formed at a position of the bottom surface 153a corresponding to the lift pin 37. The lift pin 37 moves up and down through the through hole 158, thereby realizing a state where the substrate S is housed in the recess 153 and a state where the substrate S is raised upward from the recess 153. Furthermore, according to the present invention, all the four through holes 158 are arranged in the groove 153e corresponding to the outer peripheral region of the bottom surface 153a. As shown in a partially enlarged view in FIG. 2B, this allows the liquid L (more specifically, the residual liquid La described later) trapped in the groove 153e to be discharged downward from the support tray 15A through the through holes 158. In this way, the through holes 158 correspond to an example of a "second through hole" of the present invention, and have a function as the "discharge part" of the present invention in addition to the function for up-down movement of the lift pins 37.

As shown in FIG. 2B, according to the present embodiment, a through hole 153d penetrating downward from a bottom surface of the groove 153e is provided in addition to the through holes 158 for the lift pins 37 described above. This allows the liquid L (more specifically, the residual liquid La described later) trapped in the groove 153e to be discharged downward from the support tray 15A through the through holes 153d. The through hole 153d having a dedicated function as the "discharge part" of the present invention corresponds to an example of a "first through hole" of the present invention.

The recess 153 has a peripheral edge where the support pins 152 are arranged. While the number of the support pins 152 is determined freely, it is desirably equal to or greater than 3 from the viewpoint of supporting the substrate S stably. In the present embodiment, three support pins 152 are attached to corresponding ones of the standing portions 155 to 157 in such a manner as to surround the bottom surface 153a in a plan view from above. As shown in a partially enlarged view in FIG. 2A, the support pins 152 each have a height regulator 152a and a horizontal position regulator 152b.

The height regulator 152a has a planar upper surface. By abutting on a peripheral edge of a lower surface Sb of the substrate S, the height regulator 152a supports the substrate S and regulates the position of the substrate S in the vertical direction Z (this position will be called a "height position"). The horizontal position regulator 152b extends upward further than an upper end of the height regulator 152a. By abutting on a side surface of the substrate S, the horizontal position regulator 152b regulates the position of the substrate S in a horizontal direction (XY direction). As shown in FIG. 2C, by the provision of the support pins 152, the substrate S is supported in a horizontal posture separated upward from the bottom surface 153a of the recess 153 while facing the bottom surface 153a.

As shown in FIG. 2C, the upper surface Sa and the lower surface Sb of the substrate S supported in this way are located at a height position H1 and a height position H2 in the vertical direction Z respectively. The central region of the bottom surface 153a is located directly below the lower surface Sb of the substrate S, and the bottom surface of the groove 153e is located at a position H5 still below the height position of the central region (sign H4 in FIG. 5) in the vertical direction Z. Here, while the size of a gap GP0 between the substrate S and the groove 153e, namely, a distance from the lower surface Sb of the substrate S to the bottom surface of the groove 153e is determined freely, it is set to 3.5 mm in the present embodiment.

The configurations and functions of the standing portions 155 to 157 will be described next by referring to FIGS. 2A to 2C. As shown in FIG. 2B, to clearly show the positions of the standing portions 155 to 157 relative to each other, a first virtual line VL1 and a second virtual line VL2 are defined in the present specification. Specifically, the first virtual line VL1 means a line passing through a center 153c of the bottom surface 153a and extending in the horizontal direction X perpendicular to a flow direction Y of a laminar flow of a processing fluid. The second virtual line VL2 means a line passing through the center 153c of the bottom surface 153a and extending parallel to the flow direction Y.

The standing portions 155 and 156 are both located on the (+Y) direction side of the internal space SP with respect to the first virtual line VL1 and are located separately on a (−X) direction side and on a (+X) direction side respectively with respect to the second virtual line VL2. The standing portions 155 and 156 are provided in proximity to a peripheral surface of the substrate S in such a manner that respective upper surfaces 155a and 156a of the standing portions 155 and 156 are both aligned with the height position H1 of the upper surface Sa of the substrate S supported by the support pins 152 in the vertical direction Z. Thus, when a processing fluid flows to the upper surface Sa of the substrate S after passing through the upper surfaces 155a and 156a of the standing portions 155 and 156, no disturbance is caused in a laminar flow formed by the processing fluid so a liquid L on the substrate S is replaced efficiently with the supercritical processing fluid. In the present specification, as viewed in the flow direction Y of the processing fluid, the (+Y) direction side and the (−Y) direction side of the internal space SP with respect to the first virtual line VL1 are called "upstream" and "downstream" respectively.

The standing portion 157 is provided on the (−Y) direction side of the internal space SP with respect to the first virtual line VL1, namely, on the downstream side, and like the standing portions 155 and 156, in proximity to the peripheral surface of the substrate S in such a manner that an upper surface 157a of the standing portion 157 is aligned with the height position H1 of the upper surface Sa of the substrate S. Thus, the processing fluid and the liquid L having passed through the upper surface Sa of the substrate S are discharged through the upper surface 157a of the standing portion 157. In some cases, however, part of the liquid L may get into a narrow gap between the lower surface Sb of the substrate S and the bottom surface 153a of the recess 153, as described above. In this regard, according to the present embodiment, the support tray 15A has the groove 153e and the discharge part (including the cutout portions 153b, the through holes 153d, and the through holes 158) to achieve the following operation and effect. Here, the operation and effect will be described by making comparison to a conventional example shown in FIG. 3 having a configuration like that of the conventional technique without a groove and a discharge part.

Figure 3:
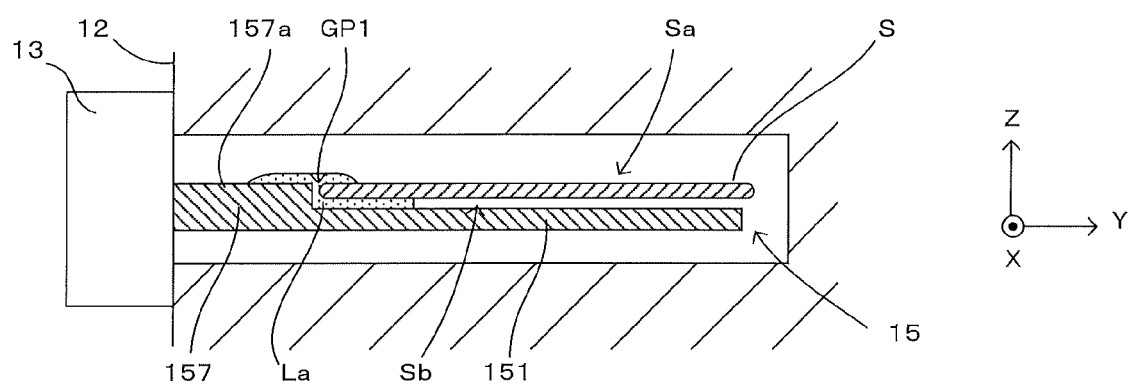
FIG. 3 schematically shows the configuration of a support tray according to the conventional technique.

FIG. 3 schematically shows the configuration of a support tray according to the conventional technique. The conventional technique shown in FIG. 3 has a configuration similar to that of the first embodiment except that the support tray 15 does not have structures corresponding to the groove 153e and the discharge part of the first embodiment. In particular, the standing portion 157 is provided in proximity to the peripheral surface of the substrate S in such a manner as to be aligned with the height position H1 of the upper surface Sa of the substrate S supported by the support pins 152. This causes the residual liquid La to easily come through a gap GP1 between the substrate S and the standing portion 157 on the downstream side and to easily get into a narrow gap between the lower surface Sb of the substrate S and the bottom surface 153a of the support tray 15 and remain therein. On the occurrence of backflow of this residual liquid La, part of the residual liquid La may re-adhere to the upper surface Sa of the substrate S.

By contrast, according to the first embodiment, while the residual liquid La comes through the gap GP1 between the substrate S and the standing portion 157 on the downstream side, this residual liquid La is trapped in the groove 153e, as shown in FIGS. 2A to 2C. Then, while the residual liquid La flows in the groove 153e, the residual liquid La is discharged into the internal space SP through the through holes 153d and 158 and through the cutout portions 153b functioning as the discharge part, as indicated by dotted arrows in FIG. 2B and solid arrows in FIG. 2C. This considerably reduces the amount of the residual liquid La remaining between the lower surface Sb of the substrate S and the bottom surface 153a of the support tray 15 compared to the conventional technique, thereby preventing backflow of the residual liquid La to the substrate S effectively. As a result, it becomes possible to dry the substrate S favorably in the substrate processing apparatus 1.

According to the present embodiment, while the types or the number of the discharge parts is determined freely, three types of discharge parts are provided that are the three cut-out portions 153b, the three through holes 153d, and the four through holes 158. This allows the residual liquid La to be discharged efficiently through the groove 153e. Furthermore, these discharge parts are arranged symmetrically with respect to the second virtual line VL2. Thus, as shown in FIGS. 2A and 2B, the residual liquid La flowing in the groove 153e having a ring-like shape in a plan view from above can be discharged in a well-balanced manner. As a result, it becomes possible to prevent the residual liquid La from remaining in the groove 153e effectively.

As described above, according to the first embodiment, the support pin 152 corresponds to an example of a "support member" of the present invention. The (+Y) direction side and the (−Y) direction side of the internal space SP correspond to "one end side of internal space" and "the other end side of the internal space" of the present invention respectively. The standing portions 155 and 156 each correspond to an example of an "upstream-side standing portion" of the present invention. The standing portion 157 corresponds to an example of a "downstream-side standing portion" of the present invention.

Second Embodiment

Figure 4A:
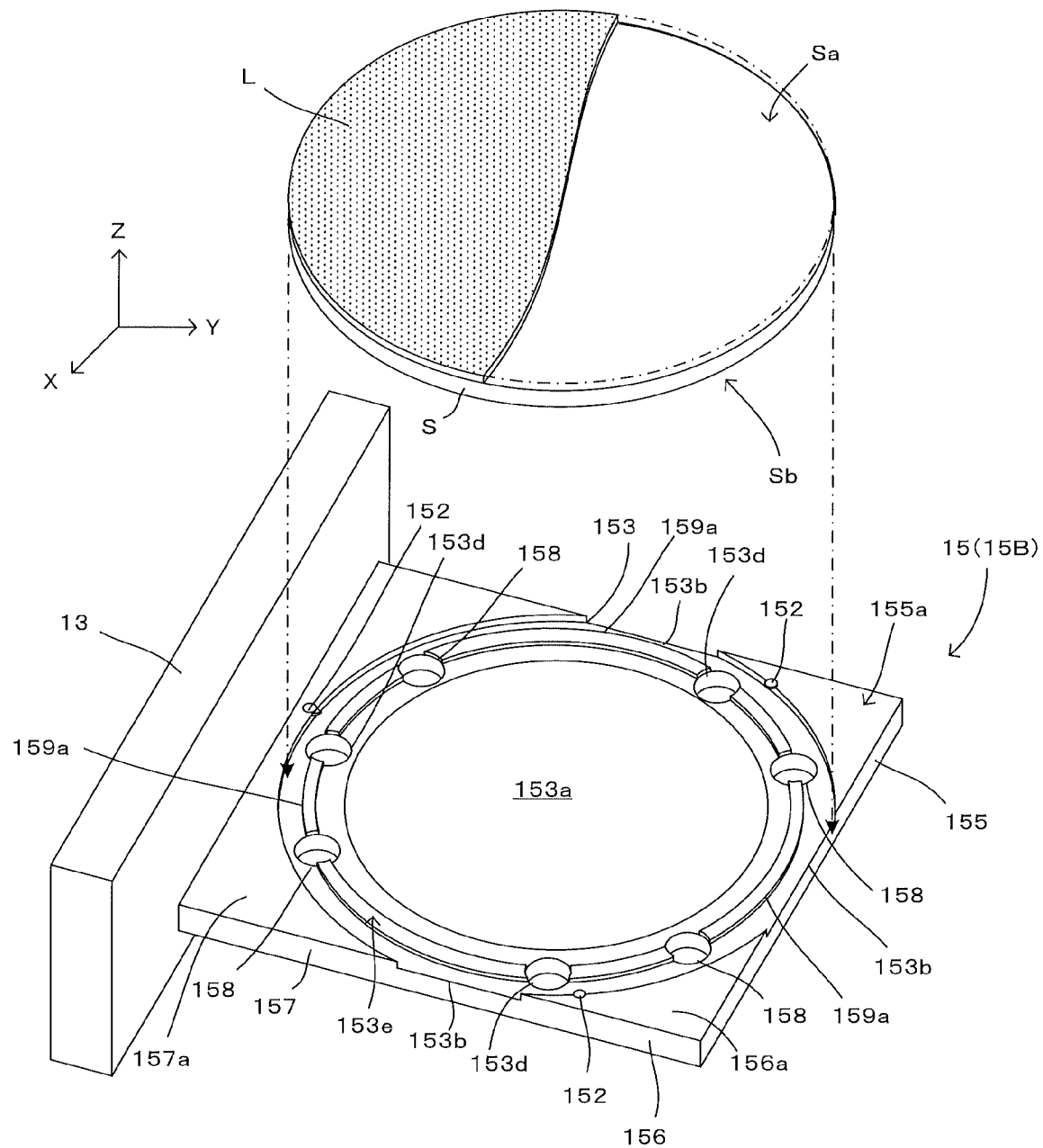
FIG. 4A is a perspective view showing a second embodiment of the support tray.
Figure 4B:
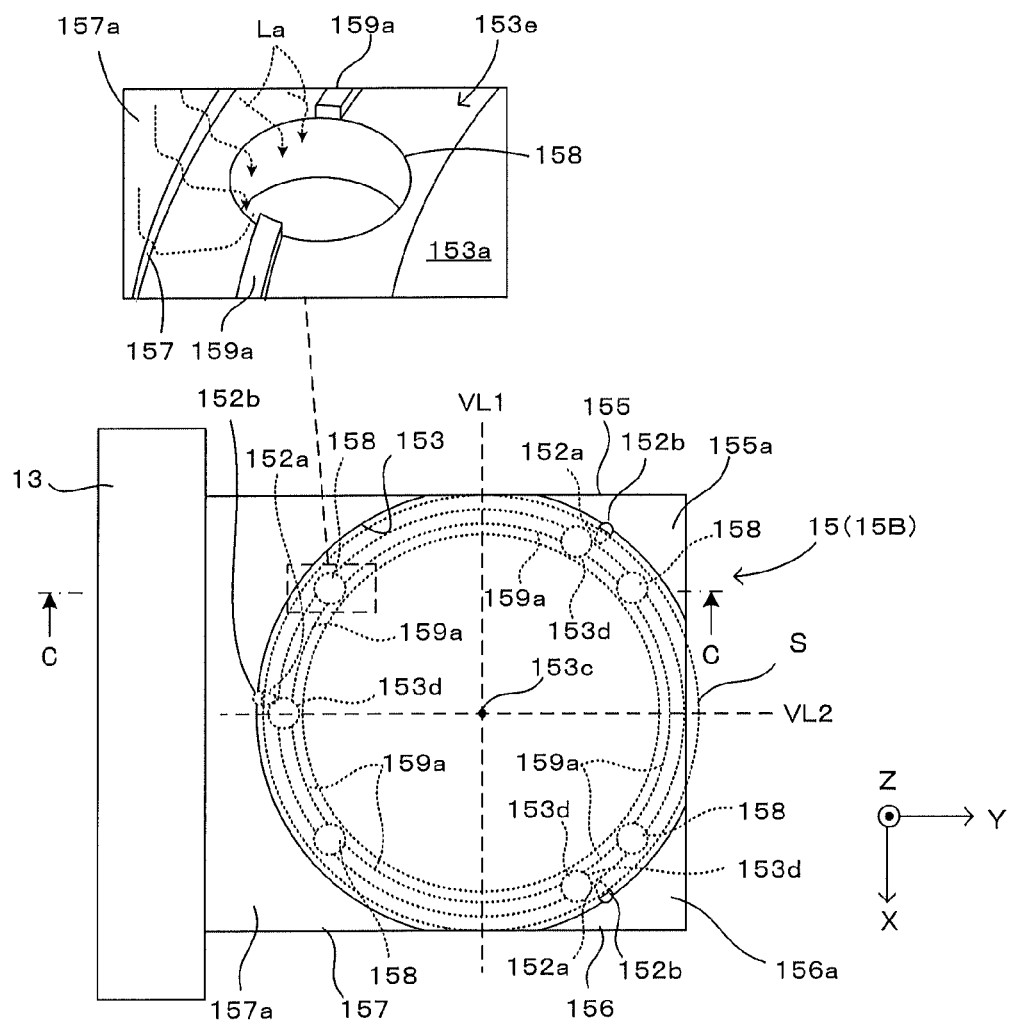
FIG. 4B is a plan view of the support tray shown in FIG. 4A.
Figure 4C:
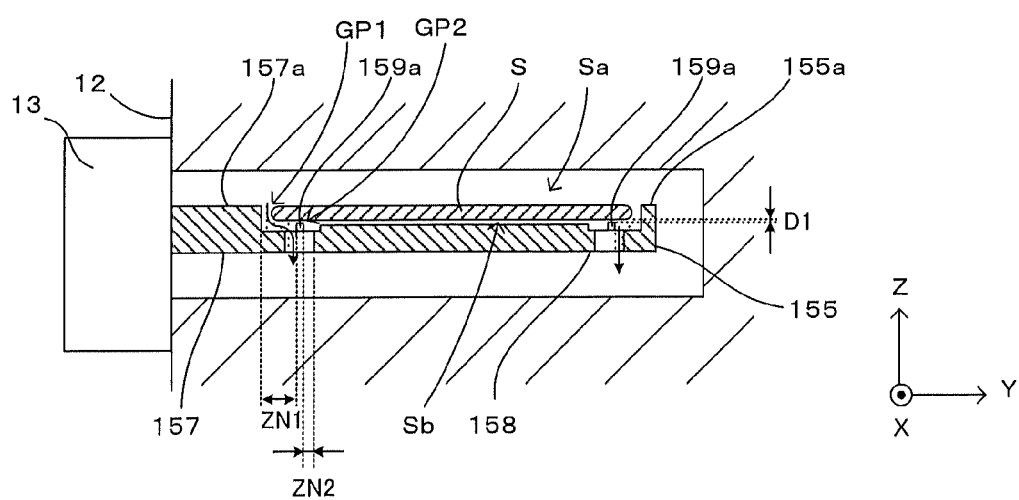
FIG. 4C is a sectional view taken along a line C-C in FIG. 4B.

FIG. 4A is a perspective view showing a second embodiment of the support tray. FIG. 4B is a plan view of the support tray shown in FIG. 4A. FIG. 4B includes a partially enlarged view showing a configuration including the through hole 158 and its neighboring area, and showing how a liquid is discharged through the through hole 158. FIG. 4C is a sectional view taken along a line C-C in FIG. 4B. The second embodiment largely differs from the first embodiment in that it additionally includes a first block section 159a arranged in the groove 153e, and the basic configuration of the second embodiment is otherwise the same as that of the first embodiment.

The first block section 159a is one of elements forming a support tray 15B, and is arranged on a virtual circle (not shown in the drawings) connecting the respective centers of the through holes 153d and the through holes 158 along the groove 153e. Specifically, the first block section 159a is provided between the through holes 153d and 158 adjacent to each other and between the through holes 158 and 158 adjacent to each other, and protrudes upward from the bottom surface of the groove 153e. As shown in FIG. 4C, each of the first block sections 159a stands from the bottom surface of the groove 153e in such a manner as to locate an upper end of the first block section 159a in the vicinity of the lower surface Sb of the substrate S supported by the support pins 152. Furthermore, according to the present embodiment, the first block section 159a is provided in such a manner that the upper end thereof is at a height H3 (see FIG. 5) above the central region of the bottom surface 153a in the vertical direction Z. By doing so, the interior of the groove 153e is partitioned into two areas by the first block section 159a, as shown in FIG. 4C. A first one of the areas is a main trapping zone ZN1 located external to the first block section 159a in a radial direction of the substrate S and bordering the gap GP1 between the substrate S and the standing portions 155 to 157. A second one of the areas is an auxiliary trapping zone ZN2 located internal to the first block section 159a in the radial direction of the substrate S and bordering a gap GP2 between the substrate S and the upper end of the first block section 159a. Specifically, the main trapping zone ZN1 is continuous with the gap GP1. Thus, much of the entering liquid coming from the gap GP1 is guided to the main trapping zone ZN1 by the first block section 159a and then trapped therein. To realize this trapping reliably, the first block section 159a is desirably above the bottom surface 153a (substrate facing surface) of the recess 153 in the vertical direction Z and in proximity to the lower surface Sb of the substrate S. According to the present embodiment, a distance D1 from the lower surface Sb of the substrate S supported by the support pins 152 to the upper end of the first block section 159a (see FIG. 4C) is set to 1.5 mm.

The entering liquid coming through the gap GP2 is guided to the auxiliary trapping zone ZN2 and then trapped therein. In this way, the residual liquid La is trapped in two stages. The residual liquid La trapped in the main trapping zone ZN1 and the auxiliary trapping zone ZN2 flows in the groove 153e and is discharged into the internal space SP through the discharge part (including the cutout portions 153b, the through holes 153d, and the through holes 158), like in the first embodiment.

According to the second embodiment having the foregoing configuration, it is possible to efficiently trap the entering liquid coming from the gap GP1 and discharge the liquid through the discharge part. It is also possible to prevent the residual liquid La from entering the central region of the bottom surface 153a reliably using the first block section 159a. Thus, the amount of the residual liquid La remaining between the lower surface Sb of the substrate S and the bottom surface 153a of the support tray 15 can be reduced, compared to the first embodiment. As a result, the effect of preventing backflow of the residual liquid La is enhanced compared to the first embodiment to allow the substrate S to be dried favorably in the substrate processing apparatus 1.

Much of the liquid coming through the gap GP2 moves along the lower surface Sb of the substrate S. Hence, locating the upper end of the first block section 159a below the central region of the bottom surface 153a of the support tray 15 in the vertical direction Z results in the failure to trap the liquid in the auxiliary trapping zone ZN2. This increases a likelihood that the liquid will get in between the bottom surface 153a of the support tray 15 and the lower surface of the substrate S. In this regard, according to the present embodiment, the amount of protrusion of the first block section 159a (=H3–H5) is set in such a manner that the upper end of the first block section 159a is located at a height position (sign H3 in FIG. 5) that is the same as or higher than the height position (sign H4 in FIG. 5) of the bottom surface 153a of the support tray 15. This also applies to a second block section described next.

Third Embodiment

In the above-described second embodiment, the interior of the groove 153e is partitioned into the main trapping zone ZN1 and the auxiliary trapping zone ZN2. Meanwhile, one or a plurality of block sections may be added in the auxiliary trapping zone ZN2 to partition the auxiliary trapping zone ZN2 further into a plurality of zones. According to a third embodiment shown in FIG. 5, for example, one second block section 159b is added in the auxiliary trapping zone ZN2.

FIG. 5 is a perspective view showing the third embodiment of the support tray. The second block section 159b is arranged internal to the first block section 159a in the radial direction of the substrate S. Like the first block section 159a, the second block section 159b is provided between the through holes 153d and 158 adjacent to each other and between the through holes 158 and 158 adjacent to each other, and protrudes upward from the bottom surface of the groove 153e. Thus, as shown in a partially enlarged view of FIG. 5, each of the second block sections 159b also stands from the bottom surface of the groove 153e in such a manner as to locate an upper end of the second block section 159b in the vicinity of the lower surface Sb of the substrate S supported by the support pins 152. By doing so, the interior of the auxiliary trapping zone ZN2 is partitioned into two areas by the second block section 159b as follows:

A first auxiliary trapping zone ZN2a. This is an area located between the first block section 159a and the second block section 159b in the radial direction of the substrate S and used for trapping an entering liquid coming through the gap GP2.

A second auxiliary trapping zone ZN2b. This is an area located internal to the second block section 159b in the radial direction of the substrate S and used for trapping the entering liquid coming through a gap GP3 between the lower surface Sb of the substrate S and the upper end of the second block section 159b.

As a result, it becomes possible for the residual liquid La not having been trapped successfully in the main trapping zone ZN1 to be trapped reliably.

Fourth Embodiment

Figure 6:
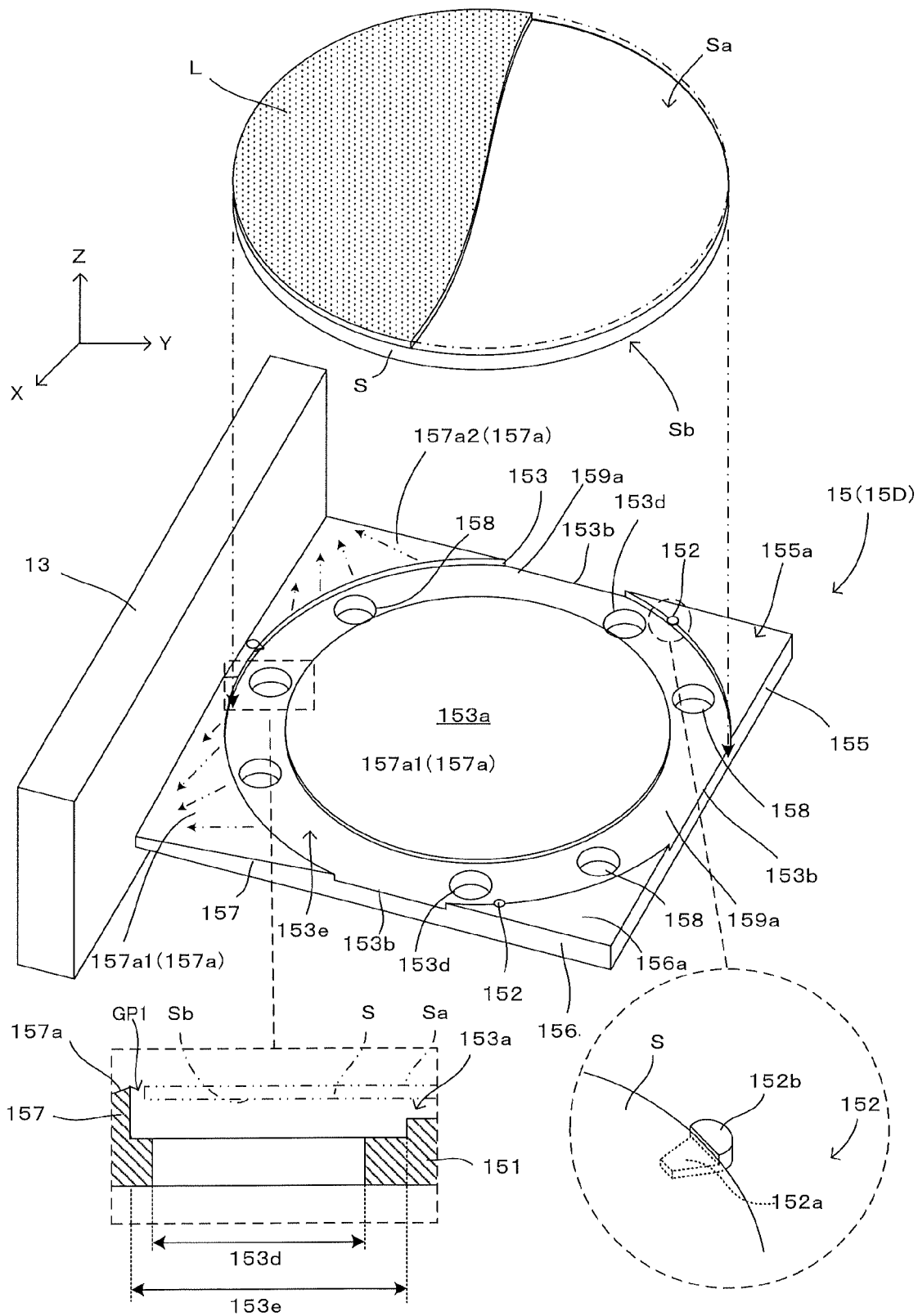
FIG. 6 is a perspective view showing a fourth embodiment of the support tray.

FIG. 6 is a perspective view showing a fourth embodiment of the support tray. The fourth embodiment largely differs from the first embodiment in the shape of the upper surface 157a of the standing portion 157. Specifically, in the support tray 15A of the first embodiment, the upper surface 157a is a single horizontal surface having the height position H1 in any region. By contrast, in the support tray 15D of the fourth embodiment, the upper surface 157a is composed of an inclined surface. While this inclined surface is at the height position H1 in the adjoining substrate S like in the first embodiment, the inclined surface becomes lower in height as the inclined surface extends further in the flow direction Y of a processing fluid, namely, as the included surface extends further from the (+Y) direction side toward the (−Y) direction side. Furthermore, with the (+X) direction side and the (−X) direction side of the first virtual line VL1 with respect to the second virtual line VL2 defined as a left side and a right side respectively, the upper surface 157a of the standing portion 157 has a left-side inclined region 157a1 that becomes lower in height as the left-side inclined region 157a1 extends further from the second virtual line VL2 toward the left side and a right-side inclined region 157a2 that becomes lower in height as the right-side inclined region 157a2 extends further from the second virtual line VL2 toward the right side. This allows the residual liquid La having flowed back (see FIGS. 2C and 2D) and certainly the processing fluid having passed through the upper surface Sa of the substrate S to be discharged efficiently from an end surface on the (+X) side and an end surface on the (−X) side of the support tray 15 while flowing the residual liquid La and the processing fluid to the right and to the left separately, as indicated by two-dot chain lines in FIG. 6. As a result, it becomes possible to prevent the residual liquid La from flowing back to the substrate S more effectively than in the first embodiment.

Fifth Embodiment

Figure 7:
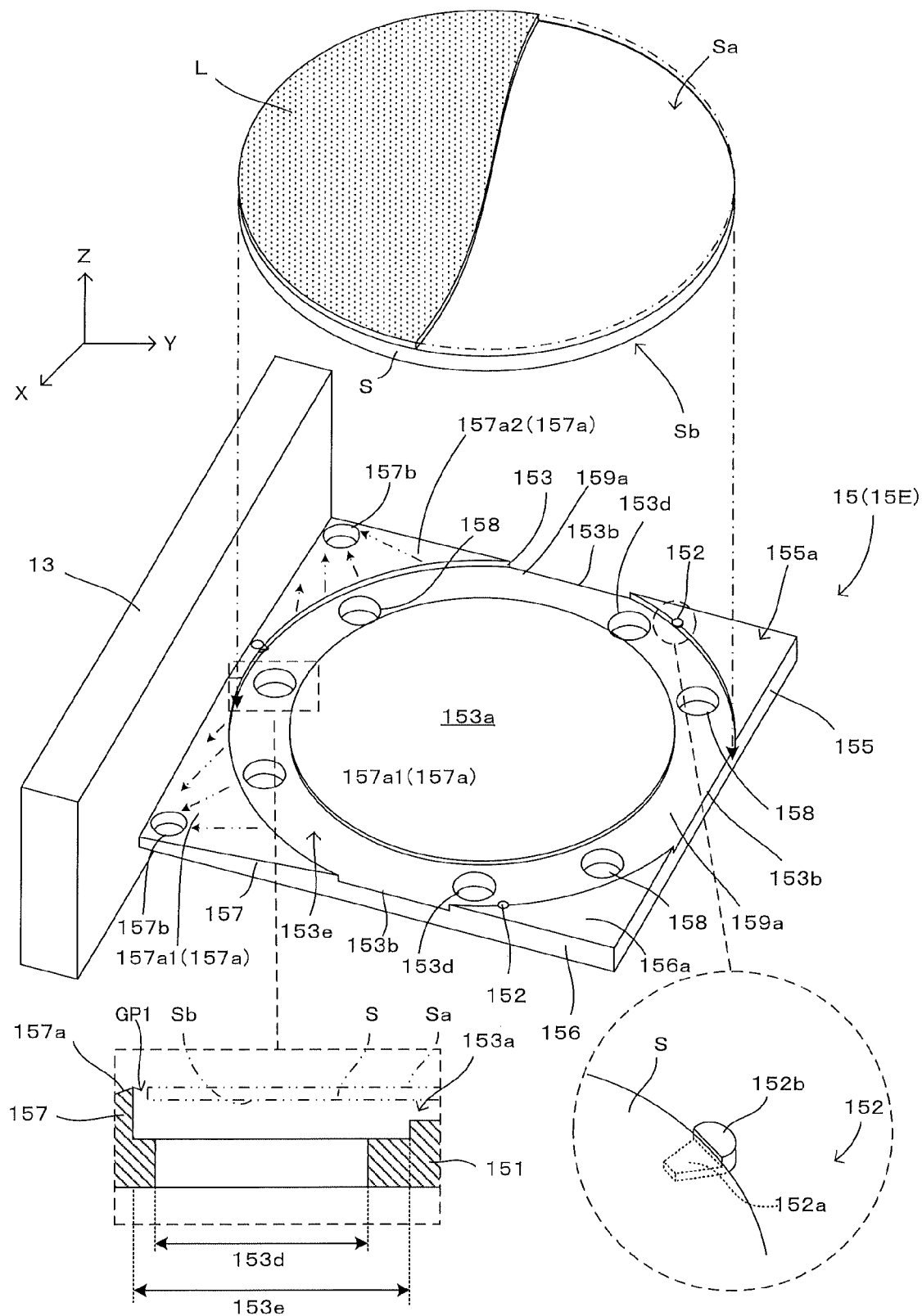
FIG. 7 is a plan view showing a fifth embodiment of the support tray.

FIG. 7 is a plan view showing a fifth embodiment of the support tray. The support tray 15E of the fifth embodiment additionally includes through holes 157b. As shown in FIG. 7, in the support tray 15E of the fifth embodiment, a part of the left-side inclined region 157a1 on the (+X) direction side and on the (−Y) direction side (this part will be called a "left-side low part") is a lowermost part in the vertical direction Z, and the left-side through hole 157b is provided in this part. Furthermore, a part of the right-side inclined region 157a2 on the (−X) direction side and on the (−Y) direction side (this part will be called a "right-side low part") is a lowermost part in the vertical direction Z, and the right-side through hole 157b is provided in this part. This allows the residual liquid La and certainly a processing fluid having passed through the upper surface Sa of the substrate S to correct in the left-side low part and the right-side low part and to be discharged efficiently through the through hole 157b. As a result, it becomes possible to prevent the residual liquid La more effectively than in the fourth embodiment.

Note that the invention is not limited to the embodiments described above and various changes other than the aforementioned ones can be made without departing from the gist of the invention. For example, the inclined surface structure employed in the fourth embodiment may be added to the first to the third embodiments. Furthermore, the through hole 157b employed in the fifth embodiment may also be added to the first to third embodiments.

In the above-described embodiments, the groove 153e is formed along an entire perimeter of the outer peripheral region of the bottom surface 153a. Alternatively, a continuous groove may be formed only in a region where entry of the liquid L causes a problem that may be a region in proximity to the standing portion 157 or a region on the downstream side with respect to the first virtual line VL1, for example.

In each of the above-described embodiments, the substrate S is supported while separated from the bottom surface 153a of the support tray 15 using the support pins 152. Instead of provision of the support pins 152, a protrusion may be provided at the bottom surface 153a for supporting the substrate. In this case, this protrusion corresponds to the "support member" of the present invention.

In the above-described embodiments, the through hole 158 as a passage for the lift pin 37 is provided in the bottom surface of the groove 153e at the support tray 15. Alternatively, the through hole 158 for up-down movement of a lift pin may be provided at a position off the groove 153e. The present invention is applicable to a substrate processing apparatus without such a through hole for up-down movement of a lift pin. In such substrate processing apparatuses, as a through hole for up-down movement of a lift pin does not function as the "discharge part" of the present invention, it is essential to provide the through hole 153d and/or the cutout portion 153b.

While various types of chemical substances such as IPA and carbon dioxide, for example, are given in the above-described embodiments as representative examples of available substances, they do not mean that a subject of application of the present invention is limited to a technique using such substances.

Although the invention has been described by way of the specific embodiments above, this description is not intended to be interpreted in a limited sense. By referring to the description of the invention, various modifications of the disclosed embodiments will become apparent to a person skilled in this art similarly to other embodiments of the invention. Hence, appended claims are thought to include these modifications and embodiments without departing from the true scope of the invention.

The present invention is applicable to every type of substrate processing technique of processing a substrate with a liquid adhering to a surface of the substrate using a processing fluid in a supercritical state.

What is claimed is:

1. A substrate processing apparatus that processes a substrate with a liquid adhering to an upper surface of the substrate using a processing fluid in a supercritical state, the apparatus comprising:

a support tray including a tray member having a substrate facing surface facing a lower surface of the substrate and a plurality of support members attached to the tray member in such a manner as to surround the substrate facing surface, the support tray supporting the substrate while separating the substrate upward from the substrate facing surface using the support members;

a chamber having internal space capable of housing the support tray supporting the substrate; and a fluid supplier configured to supply the processing fluid into the internal space from a first end side of the internal space, thereby forming a laminar flow of the processing fluid flowing toward a second end side of the internal space along the upper surface of the substrate supported by the support tray, wherein with the second end side of the internal space with respect to a first virtual line defined as a downstream side, the first virtual line passing through a center of the substrate facing surface and extending in a horizontal direction perpendicular to a flow direction of the laminar flow, the tray member includes:

a downstream-side standing portion standing upward further than the substrate facing surface while located in proximity to a peripheral surface of the substrate on the downstream side;

a groove provided in a downstream-side adjoining region belonging to an outer peripheral region of the substrate facing surface and adjoining the downstream-side standing portion, the groove being configured to trap the liquid entering the downstream-side adjoining region through a gap between the substrate and the downstream-side standing portion; and a discharge part configured to connect an interior of the groove to the internal space so as to discharge the liquid trapped in the groove into the internal space.

2. The substrate processing apparatus according to claim 1, wherein
the discharge part is a first through hole penetrating downward from a bottom surface of the groove.

3. The substrate processing apparatus according to claim 2, wherein
the discharge part has a plurality of the first through holes.

4. The substrate processing apparatus according to claim 3, wherein
the first through holes are arranged symmetrically with respect to a second virtual line passing through the center of the substrate facing surface and extending parallel to the flow direction.

5. The substrate processing apparatus according to claim 1, further comprising:
a plurality of lift pins having respective upper ends configured to protrude upward further than the substrate facing surface through second through holes provided in the tray member to abut on the lower surface of the substrate, thereby becoming capable of supporting the substrate from below, wherein
at least one of the second through holes penetrates a bottom surface of the groove to function as the discharge part.

6. The substrate processing apparatus according to claim 1, wherein
the downstream-side standing portion has an upper surface as an inclined surface that becomes lower in height as the inclined surface extends further in the flow direction.

7. The substrate processing apparatus according to claim 1, wherein
with the first end side of the internal space with respect to the first virtual line defined as an upstream side,
the tray member includes an upstream-side standing portion standing upward further than the substrate facing surface while located in proximity to a peripheral surface of the substrate on the upstream side, and
the upstream-side standing portion has an upper surface at the same height as the upper surface of the substrate in a vertical direction.

8. The substrate processing apparatus according to claim 7, wherein
the groove is provided along an entire perimeter of the outer peripheral region of the substrate facing surface in such a manner as to have a ring-like shape in a plan view from above.

9. The substrate processing apparatus according to claim 8, wherein
the upstream-side standing portion and the downstream-side standing portion are separated from each other in the flow direction to form a cutout portion as a cutout from a side surface of the groove, and the cutout portion is provided in such a manner as to allow the liquid trapped in the groove to be discharged from the tray member in the horizontal direction to function as the discharge part.

10. The substrate processing apparatus according to claim 1, wherein
the support tray includes a first block section having an upper end protruding from a bottom surface of the groove while provided in proximity to the lower surface of the substrate, and
the first block section partitions the interior of the groove into a main trapping zone and an auxiliary trapping zone, the main trapping zone communicating with the gap between the substrate and the downstream-side standing portion, thereby trapping the liquid entering the downstream-side adjoining region, the auxiliary trapping zone communicating with a gap between the substrate and the upper end of the first block section, thereby trapping the liquid entering the downstream-side adjoining region across the first block section.

11. The substrate processing apparatus according to claim 10, wherein
the upper end of the first block section is at a height position below a height position of the lower surface of the substrate and above a height position of the substrate facing surface in a vertical direction.

12. The substrate processing apparatus according to claim 10, wherein
the support tray includes a second block section standing from the bottom surface of the groove in the auxiliary trapping zone, and
the second block section partitions an interior of the auxiliary trapping zone into a plurality of zones.

13. The substrate processing apparatus according to claim 12, wherein
the second block section has an upper end at a height position below a height position of the lower surface of the substrate and above a height position of the substrate facing surface in a vertical direction.

14. A substrate processing method of processing a substrate with a liquid adhering to an upper surface of the substrate using a processing fluid in a supercritical state, the method comprising:
providing a substrate processing apparatus according to claim 1;
housing the support tray into the internal space of the chamber, the support tray supporting the substrate while separating the substrate upward from the substrate facing surface using the plurality of support members;
supplying the processing fluid into the internal space from the first end side of the internal space, thereby forming a laminar flow of the processing fluid flowing toward the second end side of the internal space along the upper surface of the substrate supported by the support tray; and
performing a discharging operation that includes:
discharging the liquid together with the processing fluid from the upper surface of the substrate in the laminar flow toward the second end side of the internal space through an upper surface of the downstream-side standing portion;
trapping the liquid in the groove as the liquid comes through the gap between the substrate and the downstream-side standing portion; and discharging the liquid trapped in the groove into the internal space through the discharge part.

\* \* \* \* \*